United States Patent
Ranish et al.

(10) Patent No.: US 7,147,359 B2
(45) Date of Patent: Dec. 12, 2006

(54) LAMP ASSEMBLY HAVING FLEXIBLY POSITIONED RIGID PLUG

(75) Inventors: Joseph M. Ranish, San Jose, CA (US); Abhijit Desai, Fremont, CA (US); Apollo Havelind, Hillsboro, OR (US)

(73) Assignee: Applied Materials, Inc., Santa Clara, CA (US)

( * ) Notice: Subject to any disclaimer, the term of this patent is extended or adjusted under 35 U.S.C. 154(b) by 198 days.

(21) Appl. No.: 10/877,246

(22) Filed: Jun. 25, 2004

(65) Prior Publication Data

US 2005/0286243 A1    Dec. 29, 2005

(51) Int. Cl.
*H01R 33/975* (2006.01)

(52) U.S. Cl. .................. 362/652; 362/278; 362/640; 362/657; 439/247

(58) Field of Classification Search .................. 362/89
See application file for complete search history.

(56) References Cited

U.S. PATENT DOCUMENTS

| | | |
|---|---|---|
| 3,945,707 A | 3/1976 | Fitzgerald |
| 4,891,499 A | 1/1990 | Moslehi |
| 4,956,538 A | 9/1990 | Moslehi |
| 5,003,217 A | 3/1991 | Buschmann |
| 5,155,336 A | 10/1992 | Gronet et al. |
| 5,876,249 A | 3/1999 | Kim |
| 6,034,356 A | 3/2000 | Paranjpe |
| 6,072,160 A | 6/2000 | Bahl |
| 6,164,816 A | 12/2000 | Aderhold et al. |
| 6,280,183 B1 | 8/2001 | Mayur et al. |
| 6,350,964 B1 | 2/2002 | Boas et al. |
| 6,376,804 B1 | 4/2002 | Ranish et al. |
| 6,465,949 B1 | 10/2002 | Miahara et al. |
| 6,476,362 B1 | 11/2002 | Deacon et al. |
| 6,570,137 B1 | 5/2003 | Jennings |
| 6,582,253 B1 | 6/2003 | Lau |
| 6,600,255 B1 | 7/2003 | Kai et al. |
| 6,638,088 B1 | 10/2003 | Richardson |
| 6,641,419 B1 | 11/2003 | Richardson |
| 2002/0105275 A1 | 8/2002 | Shigeoka |
| 2002/0150395 A1 | 10/2002 | Shimizu et al. |

*Primary Examiner*—Alan Cariaso
*Assistant Examiner*—Leah S Lovell
(74) *Attorney, Agent, or Firm*—Janah & Associates (57) ABSTRACT

A lamp assembly for a substrate processing chamber is described. The lamp assembly comprises a tubular body having first and second ends, a lamp element at least partially seated in the first end having a filament and first electrical connectors, transmission wires attached to the first electrical connectors, and a rigid plug flexibly positioned relative to the second end of the tubular body having second electrical connectors attached to the transmission wires. The flexibly positioned rigid plug is generally capable of a range movement in directions both perpendicular and parallel to a longitudinal axis of the tubular body. In one version, the rigid plug comprises first and second plug elements.

20 Claims, 4 Drawing Sheets

Section A-A
FIG.3

FIG.4

LAMP ASSEMBLY HAVING FLEXIBLY POSITIONED RIGID PLUG

BACKGROUND

The present invention relates to a lamp assembly for a substrate processing chamber.

A substrate processing chamber is used to process a substrate such as a semiconductor wafer or display. These chambers often use lamp assemblies, which comprise lamp elements and surrounding structure, to heat the substrate or chamber surfaces. The lamp assemblies emit radiation that can be used to heat and anneal a layer of material on the substrate, as for example in a rapid thermal processing chamber, or to decompose a gas to form a layer on a substrate, as in a CVD or epitaxial growth chamber. The lamp assemblies can rapidly generate infrared heat and are easily controllable, and thus useful, for rapidly heating a substrate.

The lamp assemblies are typically arranged as a patterned array in the chamber to uniformly heat the substrate or chamber surface. An electrical circuit provides power and signals to each lamp assembly. Typically, the lamp assembly is mounted in a receptacle, wire harness, circuit board, or other structure in the chamber. However, arrays of conventional lamp assemblies are often difficult to mount or align in a chamber during its assembly or replacement of the lamps, for example, due to difficulty in accessing the lamp assemblies. Manufacturing tolerances can also generate small dimensional variations within the lamp receptacle or in the space between a plurality of receptacles. Such dimensional variations can make mounting and alignment of a plurality of lamp assemblies into corresponding receptacles difficult and time consuming.

Other problems arise from the flexible connectors and plugs used in the lamp assemblies. For example, one conventional lamp assembly, as disclosed in U.S. Pat. No. 6,350,964 to Boas et al., assigned to Applied Materials, Inc., which is herein incorporated by reference in its entirety, comprises a lamp body, bulb and base. The lamp base mates to a receptacle on a printed circuit board (PCB) structure, facilitating easy removal and replacement of the lamp assemblies. The lamp base has a flexible elastomer plug to facilitate alignment of the lamp assemblies to receptacles on the PCB. The flexible elastomer plug also absorbs thermal expansion stresses that arise when the lamp attains elevated temperatures. However, exposure of this type of elastomer material to excessively high temperatures may lead to loss of flexibility of the elastomer material or thermal degradation of its insulating properties. This may also be a problem when the lamp assembly is exposed to high temperatures during its manufacture. For example, lamp assemblies often include some type of potting compound that is baked at high temperatures to remove or reduce its water content. The water content is removed because it undesirably absorbs the infrared heat energy released by the lamp assembly, reducing the heating efficiency of the lamp assembly. Thus, the flexible elastomer lamp plug does not allow heating to a temperature sufficiently high to limit the removal or reduction of the water content in the potting compound, thereby limiting the efficiency of the lamp assembly.

Thus, it is desirable to have a lamp assembly that can be more easily aligned with mating receptacles in a substrate processing chamber. It is also desirable to have a lamp assembly that is capable of withstanding thermal expansion stresses that arise during substrate processing. It is further desirable for the lamp assembly to have reduced water content. It is further desirable for the lamp assembly to be easily mountable and replaceable in the field.

SUMMARY

A lamp assembly for a substrate processing chamber is described. The lamp assembly comprises a tubular body having first and second ends, a lamp element seated in the first end of the tubular body having a filament and first electrical connectors, transmission wires attached to the first electrical connectors, and a rigid plug flexibly positioned relative to the second end of the tubular body having second electrical connectors attached to the transmission wires. The flexibly positioned rigid plug is generally capable of a range movement in directions both perpendicular and parallel to a longitudinal axis of the tubular body.

In one version, the rigid plug comprises first and second plug elements, the first plug element holding the second electrical connectors that are attached to the transmission wires. The first plug element is not directly attached to the tubular body. The second plug element has a fixed position relative to the second end of the tubular body and may restrict the range of motion of the first plug element. The second plug element may comprise clips which snap fit to a protruding ledge on the first plug element. The flexibly positioned rigid plug may also comprise a connector pin connecting the first and second plug elements.

In one version, the rigid plug comprises a polymer capable of being baked at a temperature of at least about 165°C. for at least about 15 hours. In one version, the rigid plug may comprise a glass-filed nylon, polymide, a Bakelite-type polymer, a ceramic material, high temperature glass, or mixtures thereof.

DRAWINGS

These features, aspects, and advantages of the present invention will become better understood with regard to the following description, appended claims, and accompanying drawings which illustrate exemplary features of the invention:

DESCRIPTION

Figure 1:
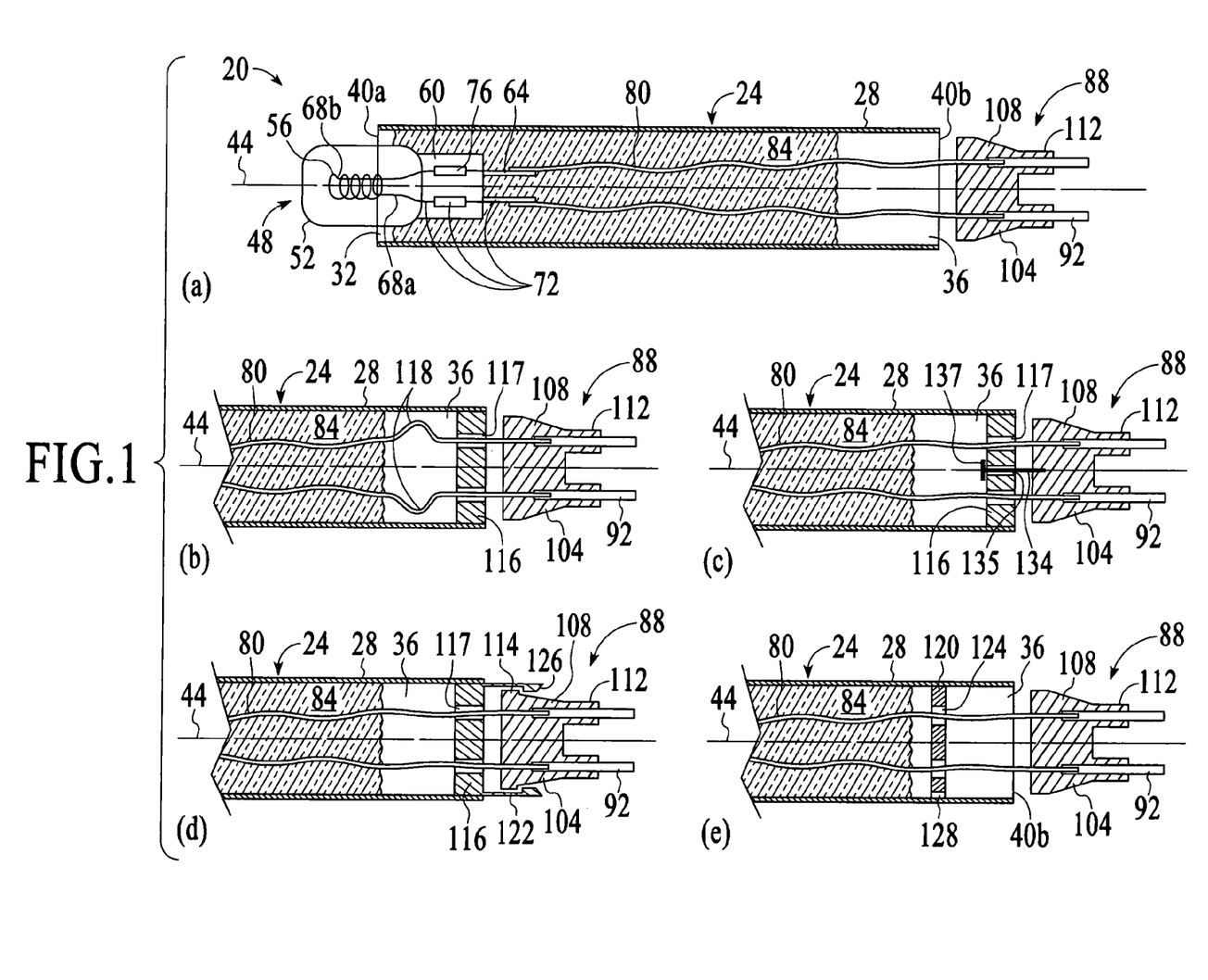
FIG. 1a is a sectional view of an embodiment of a lamp assembly according to the present invention.
FIGS. 1b–e are sectional views of other embodiments of the rigid plug flexibly positioned relative to the second end of the tubular body of the lamp assembly.

An embodiment of a lamp assembly 20 that may be used to supply heat energy to process substrates in a substrate processing chamber is illustrated in FIG. 1a. This and other embodiments of the lamp assembly 20 described herein are only illustrative examples, however, and should not be used to limit the scope of the invention.

Generally, the lamp assembly 20 comprises a tubular body 24 which provides a structural basis to contain the lamp assembly 20 and transfer heat out of the assembly 20. The tubular body 24 comprises containing walls 28 and first and second ends 32, 36. The containing walls 28 have openings 40a,b at the first and second ends 32, 36. In one version, the containing walls 28 comprise a metal that facilitates heat transfer and provides a reflective surface. For example, the tubular body 24 may comprise stainless steel, which may be brushed or polished to be reflective. In the version shown, the tubular body 24 has a circular cross-section which provides ease of manufacture. However, other cross-sectional shapes are possible, including square, rectangular, triangular and multi-arcuate shapes. The tubular body 24 has a longitudinal axis 44 parallel to the containing walls 28 and perpendicular to the cross-section of the tubular body 24.

The lamp assembly 20 comprises a lamp element 48 seated in the first end 32 of the tubular body 24. Generally, the lamp element 48 comprises a light transmissive envelope 52 that contains an internal atmosphere about a filament 56. The envelope 52 may comprise a variety of shapes, including tubular, conical, spherical, and multi-arcuate shapes. The envelope 52 also comprises a pinch seal end 60 that allows electrical connectors 64 to pass therethrough, and may also comprise an evacuation tube (not shown) used to remove or add gases to the envelope during manufacture which is subsequently sealed. The envelope 52 comprises quartz, silica glass, aluminosilicate glass or other suitably light-transmissive materials. The internal atmosphere contained in the envelope 52 comprises, for example, a halogen containing gas.

The filament 56 inside the envelope 52 of the lamp element 48 has two ends 68a,b which are electrically coupled to the electrical connectors 64. The filament 56 comprises a resistive metal wire, and in one version is a tungsten wire. The filament 56 can have single or multiple coils or coiled coils, or can comprise planar strips, and is coupled at its midpoints or endpoints 68a,b to the lamp element electrical connectors 64. The electrical properties of the filament 56 can be tuned by adjusting parameters such as its weight per unit length, diameter, and coil pitch. In operation, the filament 56 can produce radiation at a wattage range of, for example, up to about 1 kW with operating voltages of about 120 $V_{AC,rms}$. Typically, the radiation is in the deep ultraviolet, ultraviolet, visible, or infrared ranges.

The lamp element electrical connectors 64 supply power to the filament 56 from a power source outside the lamp element envelope 52 and form a continuous electrical connection between the filament 56 and the power source. The lamp element electrical connectors 64 typically comprise metal wires 72 or foils 76, or some combination thereof, with good electrical conductivity, such as molybdenum wires. The connectors 64 may also comprise other metals, such as tungsten, nickel plated steel, or any other metal with a low electrical resistance and the ability to reliably carry high currents.

The pinch seal end 60 of the envelope 52 comprises the region where the envelope 52 is physically constricted about the electrical connectors 64 of the lamp element 48. The connectors 64 pass through and are held in place by the pinch seal end 60 as they enter into the envelope 52 to electrically couple an external power source to the filament 56. The pinch seal end 60 forms a hermetic seal to maintain the pressure and composition of the internal atmosphere of the envelope 52. In another version, the lamp element 48 can have two pinch seal ends 60, at substantially opposite ends of the envelope 52, with a single connector 64 passing through each pinch seal end 60. In yet another version, there may be three connectors 64 passing through a single pinch seal end 60.

The lamp element 48 is at least partially seated in the first end 32 of the tubular body 24. In one version, the lamp element 48 is seated so that at least about 60% of the lamp envelope 52 is positioned beyond the opening 40a of the first end 32 of the tubular body 24, thus outside of the tubular body 24. This version may be advantageous to efficiently utilize the heat energy radiating from the lamp element 48. In another version, the lamp element 48 may be positioned so that substantially the entire lamp element 48 is inside the tubular body 24. This version may be advantageous to provide heat transfer from the lamp element 48 to the lamp assembly 20 for cooling portions of the lamp element 48, for example such as the envelope 52 and the pinch seal end 60.

The lamp assembly 20 also comprises one or more transmission wires 80 to transmit power to the lamp element 48 from the second end 36 of the lamp assembly 20. In one version, the lamp assembly 20 comprises a pair of transmission wires 80, each connected to one of a pair of the electrical connectors 64 of the lamp element 48. The transmission wires 80 comprise electrically conductive wires having a relatively low electrical resistance. In one version, the electrical resistance of the transmission wires 80 is no greater than about 0.1 ohms. The transmission wires 80 are electrically connected at one end to the electrical connectors 64 of the lamp element 48 by a soldered connection, a welded connection, a physical abrasion, a sonic coupling, or other type of connection in which a stable, relatively low resistance electrical connection is established. The transmission wires 80 also have an elasticity to allow for their movement and bending. For example, in one version, the transmission wires 80 have a Young's Modulus of about 30 GPa to about 130 GPa. This allows the transmission wires 80 to bend and be manipulated during assembly and operation of the lamp assembly, but also allows them to retain a sufficient amount of rigidity to hold their shape.

The lamp assembly 20 comprises a potting compound 84 inside the tubular body 24 which promotes heat transfer between the heat generating elements of the lamp assembly 20 and the tubular body 24. The heat generating elements can include, for example, the lamp element 48 and the transmission wires 80. The potting compound 84 transfers heat energy to the tubular body 24 which can then transfer the heat out of the lamp assembly 20. In one version, the potting compound 84 is at least between the pinch seal end 60 of the lamp element 48 and the containing wall 28 of the tubular body 24. For example, the potting compound 84 can be substantially about the entire pinch seal end 60 and extend all the way to the containing wall 28. The potting compound 84 can also extend beyond the pinch seal end 60 of the lamp element 48, for example, in one version the potting compound 84 extends towards the second end 36 of the tubular body 24. In one embodiment, the potting compound 84 extends to about 90% of the total length of the tubular body 24.

The potting compound 84 comprises a material with a sufficient thermal conductivity to effectively transfer heat. For example, in one version, the potting compound 84 comprises a material with a thermal conductivity of about 1 W/(K·m) to about 1.6 W/(K·m). The potting compound 84 is heated during manufacture of the lamp assembly 20 to remove or reduce its water content. For example, in one version, after heating, the potting compound 84 comprises a water content of no more than 0.1% by weight. The remaining water content is generally releasable during lamp operation. The potting compound 84 is also sufficiently malleable to facilitate its integration into the lamp assembly 20 in thermally continuous regions. In one embodiment, the potting compound 84 comprises a magnesium phosphate bonded zirconium silicate, which is advantageous because it conforms very well to the lamp element 48, for example the envelope 52 and the pinch seal end 60, without bonding so tightly such that stresses are created in the lamp envelope 52 or pinch seal end 60.

The lamp assembly 20 comprises a rigid plug 88 flexibly positioned at the second end 36 of the tubular body 24. The rigid plug 88 has electrical connectors 92 which transfer electrical power to the transmission wires 80. The rigid plug 88 comprises rigid materials that can withstand relatively high temperatures required to remove water content from the potting compound 84. In one version, the rigid plug material is capable of withstanding exposure to at least about 165° C. for at least about 15 hours. Rigid materials typically allow for exposure of the plug 88 to higher temperatures for a longer time than flexible materials. Flexible materials, such as elastomers for example, generally do not withstand exposure to relatively high temperatures as well as rigid materials because the weaker internal bonding required for flexibility also generally results in lower thermal stability. For example, Santoprene 201-64, an elastomer material used in flexible plugs, can only withstand about 150° C. for about 15 hours before its flexibility and other properties begin to unacceptably degrade.

In one version, the rigid plug material comprises a polymer which is advantageous because of its ease of manufacture and low cost. In one embodiment of this version, the material comprising the polymer is a glass-filled nylon which can be molded to high dimensional tolerances. In another embodiment, the polymer is polymide which has high thermal stability. In yet another version, the polymer is a Bakelite-type polymer. In a further version, the rigid plug material comprises a ceramic that has high temperature resistance and stability. For example, the ceramic can be mullite, high temperature glass, or alumina, or mixtures thereof. The ceramic materials can generally withstand temperature exposure to over 500° C. for in excess of about 15 hours without excessive degradation of their properties.

The rigid plug 88 is flexibly positioned relative to the second end 36 of the tubular body 24. The flexible positioning of the rigid plug 88 allows the lamp assembly 20 to overcome misalignment with a receptacle to which the rigid plug 88 mates in the substrate processing chamber. Misalignments might result from a number of sources, including dimensional variations during the manufacture of the receptacles, dimensional variations during the manufacture of the structures that hold the receptacles, and misalignments that occur during assembly of the substrate processing chamber. The flexible positioning of the rigid plug 88 allows for correction of all these causes of the misalignment between the plug 88 and the receptacle.

Advantageously, the flexibly positioned rigid plug 88 is capable of movement, reduces alignment problems with dimensional variations, and can also absorb thermal expansion stresses that arise during processing. For example, the plug 88 is capable of movement relative to the second end 36 of the tubular body 24 in both a direction parallel to the longitudinal axis 44 and in a direction perpendicular to the longitudinal axis 44. Flexibility in the positioning of the rigid plug 88 in a direction parallel to the longitudinal axis 44 of the tubular body 24 compensates for dimensional variations in this direction which could cause excessive force to be exerted on the lamp assembly or components of the processing chamber in which the lamp assembly is mounted. For example, this type of flexibility corrects for misalignments that might result from warping or bowing of components in the processing chamber which hold the receptacle to which the lamp assembly mates. Flexibility in a direction perpendicular to the longitudinal axis 44 of the tubular body 24 can compensate for dimensional variations in this direction which could prevent the lamp assembly from making an electrical connection to the receptacle, for example, to correct for misalignments between the lamp assembly and the receptacle. Flexibility of the position of the rigid plug 88 in a combination of both perpendicular and parallel directions relative to the longitudinal axis 44 can also simultaneously correct several different types of misalignments that arise from thermal expansion stresses or dimensional changes that occur during substrate processing. Thus, a lamp assembly with the flexibly positioned rigid plug 88 has several advantages over prior art assemblies.

The rigid plug 88 can also comprises a pair of electrical connectors 92 that are shaped to mate with the receiving receptacle in the substrate processing chamber and are electrically connected to the transmission wires 80. The electrical connectors 92 transfer power from the receptacle to the transmission wires 80, which in turn transfer power to the lamp element 48. The plug electrical connectors 92 comprise an electrically conductive material such as a metal. For example, in one version the connectors 92 comprise iron alloys, nickel, or copper, or mixtures thereof. In one version, the connectors 92 may comprise a combination of materials in which one material is plated or deposited onto another material.

The flexibly positioned rigid plug 88 comprises a first plug element 104 which provides a structural basis for holding the plug electrical connectors 92 and receiving the lamp assembly transmission wires 80. The first plug element 104 is not directly attached to the tubular body 24 of the lamp assembly 20. The first plug element 104 is shaped to mate with the receptacle that receives the lamp assembly 20 in the substrate processing chamber, and may include geometric elements to mate with complementary geometric elements of the receptacle. The first plug element 104 has a main body 108 to receive and at least partially encapsulate the plug electrical connectors 92 and the transmission wires 80. The plug element 104 may also have extensions 112 that further support plug electrical connectors 92 that may be relatively large in size as well as provide additional insulation for high voltage operation. Other variations on the shape and size of the first plug element 104 are also possible.

In one version, the flexibly positioned rigid plug 88 comprises only a single plug element 104 and does not comprise further plug elements, as illustrated in FIG. 1*a*. The flexible positioning of the rigid plug 88 is achieved by the direct connection of the first plug element 104 to only the transmission wires 80. In this version, the transmission wires 80 are selected to have enough elasticity and freedom of movement to allow flexibility in the position of the first plug element 104, which is achieved through movement, bending, displacement, etc. of the transmission wires 80. The direct attachment to only the transmission wires 80 allows the first plug element 104 to move both in the parallel and perpendicular directions relative to the longitudinal axis 44 of the lamp assembly 20.

In another version, the flexibly positioned rigid plug 88 may also comprise a second plug element 116 whose position is fixed relative to the second end 36 of the tubular body 24, as illustrated in FIGS. 1*b–d*. The second plug element 116 is shaped to fit in, and be secured to, the second end 36 of the tubular body 24. In one version, the second plug element 116 is substantially disc-shaped. In this version, the disc-shaped second plug element 116 is sized to fit inside the containing walls 28 of the tubular body 24. The second plug element 116 can be secured to the containing walls 28 of the second end 36 of the tubular body 24 by several means (not shown), including (i) a friction-based tight fit to the containing wall 28, (ii) tabs on the second plug element 116 designed to mate with grooves in the inner surface of the containing wall 28, and (iii) clips on the containing wall 28 signed to grab grooves or slots on the second plug element 116. Other means of securing the second plug element 116 to the tubular body 24 are also possible. The second plug element 116 comprises passages 117 to allow the transmission wires 80 to pass through the second plug element 116 to reach the first plug element 104. The wire passages 117 should be sized large enough to allow a range of movement of the transmission wires 80 in directions both perpendicular and parallel to the longitudinal axis 44 of the lamp assembly 20.

In some versions, the second plug element 116 comprises a means to influence the position of the first plug element 104. For example, the second plug element 116 may restrict the movement of the first plug element 104 in useful ways. In one version, the second plug element 116 may restrict the movement of the first plug element 104 to substantially only movement in a direction parallel to the longitudinal axis 44. Likewise, in another version, the second plug element 116 may restrict the motion of the first plug element 104 to substantially only move in a direction perpendicular to the longitudinal axis 44. In another version, the second plug element 116 may not limit the motion of the first plug element 104 to a particular direction, but instead may restrict the range of movement of the first plug element 104 in both directions. For example, the second plug element 116 may restrict the first plug element 104 to a reduced range of flexibility in both directions.

In one version, the wire passages 117 of the second plug element 116 can be used to restrict the motion of the first plug element 104, as illustrated in FIG. 1b. this version, a kink 118 is added to each transmission wire 80 on a portion of the transmission wire 80 located on the side of the second plug element 116 opposite to the first plug element 104. The kink 118 in the transmission wires 80 acts to restrict the range of the movement of the first plug element 104 in the direction parallel to the longitudinal axis 44. In this version, the range of movement of the first plug element 104 away from the tubular body 24 along the longitudinal axis 44 is reduced. This is advantageous during removal of the lamp assembly 20 from a receptacle in which it was plugged. The kink 118 in the transmission wires 80 reduces the stress put on components and connections within the lamp assembly 20 during removal of the lamp assembly 20.

In another version, the second plug element 116 comprises clips which snap fit to an appropriately-sized protruding ledge 114 on the first plug element 104, as illustrated in FIG. 1d. In this version, the snap-fit interface between the first and second plug elements 104, 116 functions to restrict the movement of the first plug element 104. The snap-fit interface comprises snap-fit clips 122 that extend away from the second end 36 of the tubular body 24 toward the first plug element 104 and have a lip 126 that engages the protruding ledge 114 on the first plug element 104. A retaining channel 130 formed by the snap-fit clips 122 allows movement of the first plug element 104 within a controlled range. The range of movement of the first plug element 104 can be selected by selecting the size of the retaining channel 130. For example, to restrict the first plug element 104 to substantially only movement in a direction parallel to the longitudinal axis 44, the retaining channel 130 is sized to have a loose fit to the protruding ledge 114 in this direction, but have a closer fit in the perpendicular direction to prevent substantial movement in this direction. Likewise, the fit of the retaining channel 130 to the protruding ledge 114 can be loose in the perpendicular direction, and closer in the parallel direction, to allow movement in the perpendicular direction and substantially prevent movement in the parallel direction. Also, the retaining channel 130 can be sized to allow movement in directions both parallel and perpendicular to the longitudinal axis 44.

In another version, the flexibly positioned rigid plug 88 comprises a connector pin 134 connecting the first and second plug elements 104, 116, as illustrated in FIG. 1c. The connector pin 134 also restricts the range of movement of the first plug element 104. The connector pin 134 passes through a pin passage 135 in the second plug element 116 and is seated in the first plug element 104. The size of the pin passage 135 in the second plug element 116 determines the range of movement of the first plug element 104 in the direction perpendicular to the longitudinal axis 44. For example, the pin passage 135 can have a similar but larger shape to the cross-sectional shape of the pin 134, thus giving the first plug element 104 a range of motion in all directions perpendicular to the longitudinal axis 44. In another version, the pin passage 135 can have a different shape, for example the pin passage 135 can be a roughly linear slot, or a square. In the version in which the pin passage 135 is a linear slot, the first plug element 104 is allowed movement along an axis of the slot, which is a subset of all the directions perpendicular to the longitudinal axis 44 of the tubular body 24. The pin 134 can also move parallel to the longitudinal axis 44, thus giving the first plug element 104 freedom of motion in this direction as well. The pin 134 has a flange 137 which is sized to prevent the flange 137 from passing through the pin passage 135, thus restricting the range of motion of the first plug element 104 along the parallel direction. The range of motion of the first plug element 104 along the parallel direction is also limited by the presence of the second plug element 116. The pin 134 may comprise a number of rigid materials, including the same materials as the first and second plug elements 104, 116, as well as metals and other suitable rigid materials.

The lamp assembly 20 may also comprise a stopper element 120 to aid in the manufacture of the lamp assembly 20 by providing a means to stopper the potting compound 84 in the tubular body 24, as illustrated in FIG. 1e. The stopper element 120 has passages 124 through with the transmission wires 80 may pass. The stopper element passages 124 should be large enough to allow movement of the transmission wires 80 both perpendicular and parallel to the longitudinal axis 44 of the tubular body 24. The stopper element 120 also has a slot 128 through which the potting compound 84 can be passed through to the interior of the tubular body 24. The slot 128 should be big enough to accommodate entry of potting compound 84 via a tube, spout, knife or similarly adequate tool, but should be small enough to substantially prevent the potting compound 84 from leaving the tubular body 24 during assembly, handling and operation of the lamp assembly 20.

Figure 2:
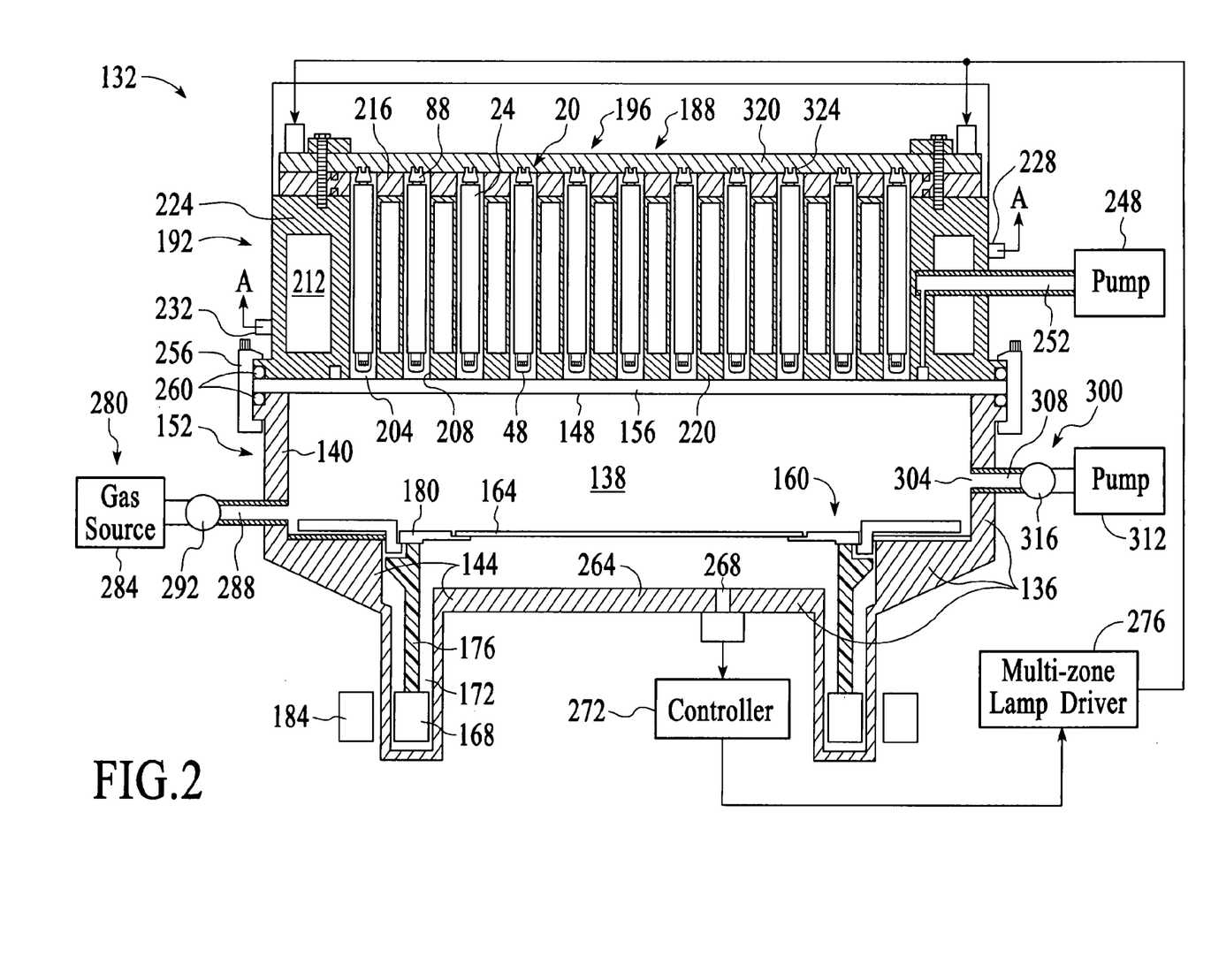
FIG. 2 is a sectional side view of a substrate processing chamber having an array of the lamp assemblies.

The lamp assembly 20 can be provided in a process chamber 132 such as a rapid thermal process chamber 132, an embodiment of which is shown in FIG. 2. The rapid thermal process chamber 132 is capable of providing a controlled thermal cycle that heats the substrate 164 for processes such as, for example, thermal annealing, thermal cleaning, thermal chemical vapor deposition, thermal oxidation and thermal nitridation. The process chamber 132 comprises chamber walls 136 enclosing a process zone 138. For example, the chamber walls 136 enclosing the process zone 138 can comprise sidewalls 140 and bottom walls 144 formed by a main body 152 and a top wall 148 formed by a window 156 resting on the main body 152. The main body 152 is made of stainless steel, although aluminum and other suitable materials may also be used. The window 156 is made of a material that is transparent to infrared light, such as clear fused silica quartz.

A substrate support 160 holds the substrate 164 during processing in the process zone 138. The substrate support 160 can comprise a rotatable structure that rotates the substrate 164 during processing. For example, the support 160 can comprise a magnetically levitated rotor 168 positioned within a channel 172 in the main body 152. The magnetically levitated rotor 168 supports a quartz support cylinder 176, on top of which is a support ring 180 to hold the substrate 164. A magnetic stator 184 located externally to the channel 172 containing the rotor 168 is used to magnetically induce rotation of the rotor 168 in the channel 172, which in turn cause rotation of the substrate 164 on the support ring 180. The substrate 164 may be rotated, for example, at about 100 to about 250 revolutions per minute.

A radiation source 188 directs radiation onto the substrate 164, and can be positioned above the substrate 164, such as in a ceiling 192 of the chamber 132 above the radiation permeable window 156 at the top of the process zone 138. The radiation source 188 generates radiation at wavelengths that heat the substrate 164, such as radiation having wavelengths of from about 200 nm to about 4500 nm. In one version, the radiation source 188 comprises a honeycomb array 196 of lamp assemblies 20. The array 196 can comprise one or more approximately radial heating zones that can be independently modulated to control temperatures across the substrate 164. For example, in one version, the radiation source 188 may comprise 409 lamps divided into 15 radially symmetric zones. Each zone can be independently controlled to provide fine control of the radial profile of heat delivered to the substrate 164. The radiation source 188 is capable of rapidly heating the substrate 164 for thermal processing, for example at a rate of from about 50° C./s to about 280° C./s.

Figure 3:
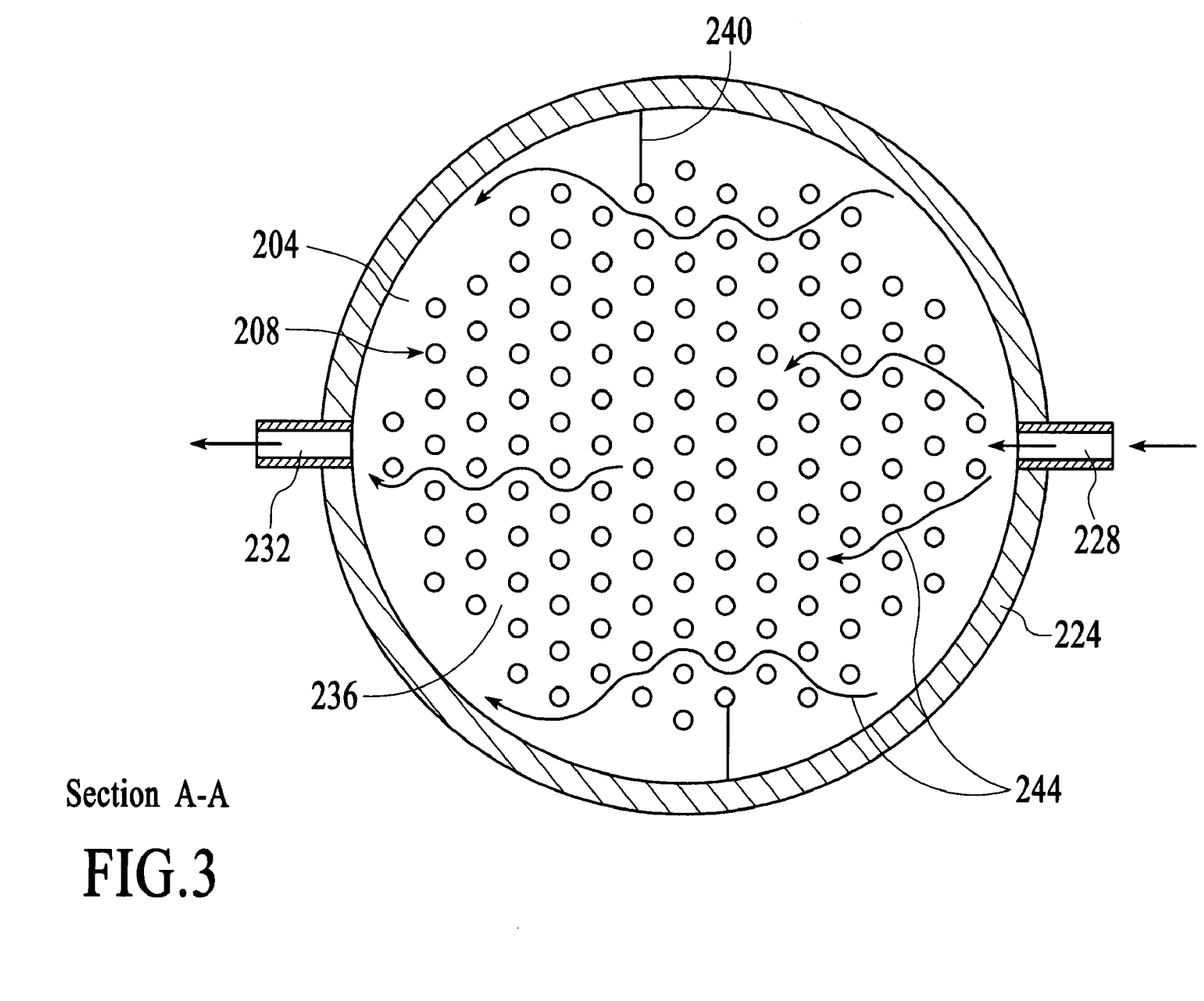
FIG. 3 is a sectional top view of the array of the lamp assemblies in a cooling chamber of the substrate processing chamber.

Each lamp assembly 20 in the array 196 of lamp assemblies 20 is enclosed in a tubular lamp assembly housing 204. One end of the lamp assembly housing 204 is adjacent to the transmission window 156. The lamp assembly housing 204 has a reflective inner surface 208 to increase the efficiency of light and heat transfer from the lamp assemblies 20 to the substrate 164. The lamp assembly housings 204 are enclosed in a fluid cooling chamber 212 defined by upper and lower fluid chamber walls 216, 220 and a cylindrical fluid chamber side wall 224. A cooling fluid, such as, for example, water, can be introduced into the cooling chamber 212 through a cooling fluid inlet 228 and removed from the cooling chamber 212 through a cooling fluid outlet 232. FIG. 3 shows a top view of the array 196 of lamp assemblies 20 in lamp assembly housings 204 in the cooling chamber 212. Cooling fluid travels in the space 236 between the lamp assembly housings 204, and may be directed by baffles 240 to ensure an effective fluid flow to transfer heat from the lamp assemblies 20 in the lamp assembly housings 204. A vacuum pump 248 is provided to reduce the pressure in the lamp assembly housings 204. The vacuum pump 248 is coupled to the lamp assembly housings 204 by a conduit 252 in the cylindrical sidewall 224 and grooves in the bottom wall 220 of the cooling chamber 212.

Clamps 256 secure the main body 152, window 156, and cooling chamber 212 together. O-rings 260 are located between the window 156 and the cooling chamber 212 and between the window 156 and the main body 152 to provide a vacuum seal at those interfaces.

The lower wall 144 of the main body 152 comprises a reflective plate 264 positioned below the substrate 164. One or more temperature sensors 268, such as pyrometers having fiber optic probes, can also be provided to detect the temperature of the substrate 164 during processing. The sensors 268 are connected to a chamber controller 272, which can use their output to determine a power level to supply to individual lamp assemblies 20 and to groups of lamp assemblies 20 in a zone. Each group of lamp assemblies 20 can be separately powered and controlled by a multi-zone lamp driver 276, which is in turn controlled by the controller 272.

A gas supply 280 can provide a process gas into the process zone 138 and control the atmosphere in the process chamber 132. The gas supply 280 comprises a source 284 of process gas and a conduit 288 having a flow control valve 292 that connects the source 284 to a gas inlet 296 in the process chamber 132 to provide gas in the chamber 132. An exhaust 300 controls the pressure of gas in the process chamber 132 and exhausts process gas from the chamber 132. The exhaust 300 can comprise one or more exhaust ports 304 that receive spent process gas and pass the spent gas to an exhaust conduit 308 that feeds one or more exhaust pumps 312. A throttle valve 316 in the exhaust conduit 308 controls the pressure of the gas in the chamber 132.

The chamber 132 is controlled by a controller 272 that comprises program code having instruction sets to operate components of the chamber 132 to maintain conditions in the chamber 132 suitable for the processing substrates. For example, the controller can 272 comprise a substrate positioning instruction set to operate one or more of the substrate support 160 and substrate transport (not shown) to position and rotate a substrate 164 in the chamber 132; a temperature control instruction set to operate the radiation source 188 to control heating of the substrate 164, and operate the temperature sensors 268 to monitor the temperature of the substrate 164; a gas flow control instruction set to operate the flow control valve 292 to set a flow of gas to the chamber 132; and a gas pressure control instruction set to operate the exhaust throttle valve 316 to maintain a pressure in the chamber 132.

The controller 272 typically comprises a suitable configuration of hardware and software to operate the components of the substrate processing chamber 132. For example, the controller 272 may comprise a central processing unit (CPU) that is connected to a memory and other components. The CPU comprises a microprocessor capable of executing a computer-readable program. The memory may comprise a computer-readable medium such as hard disks, optical compact disc, floppy disk, random access memory, and/or other types of memory. An interface between a human operator and the controller 272 can be, for example, via a display, such as a monitor, and an input device, such as a keyboard. The controller 272 may also include drive electronics such as analog and digital input/output boards, linear motor driver boards, or stepper motor controller boards.

Figure 4:
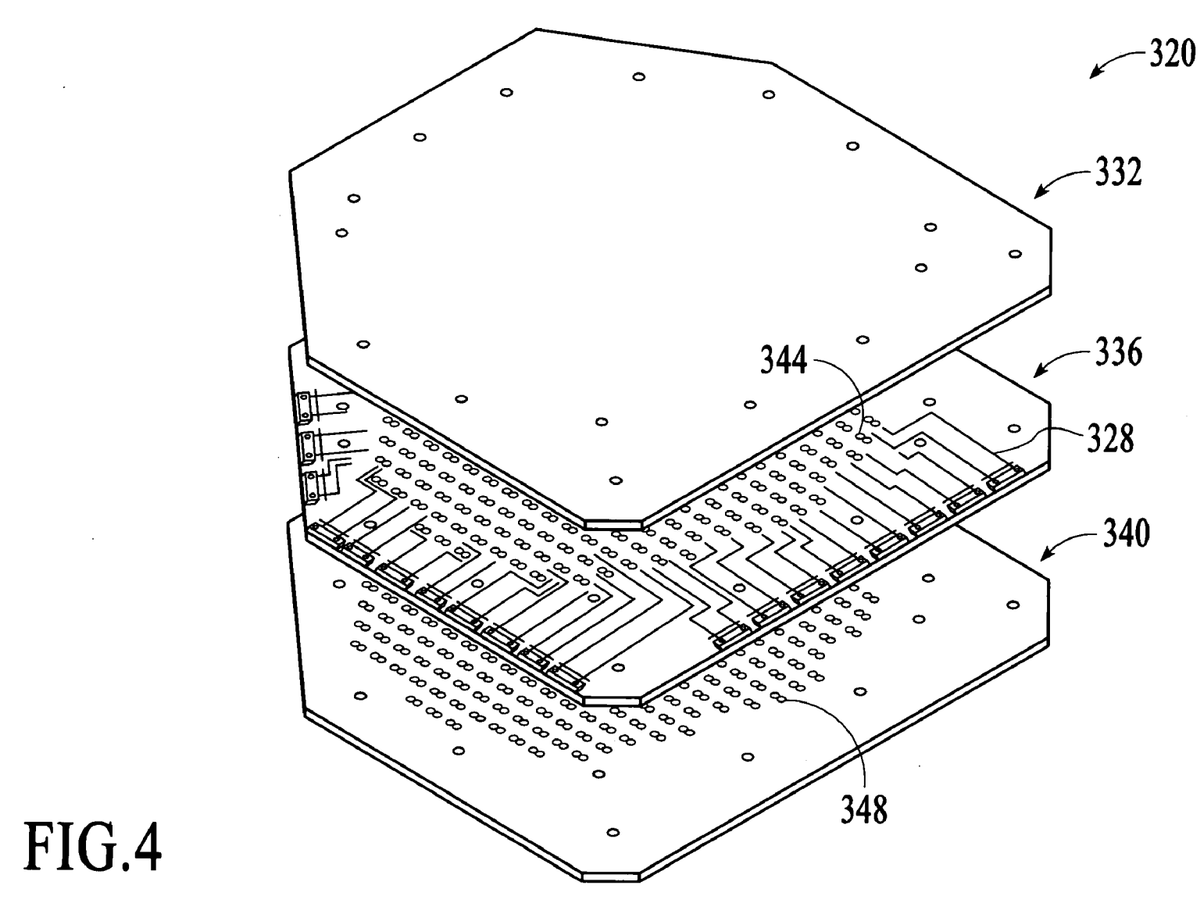
FIG. 4 is a perspective view of a printed circuit board structure on top of the cooling chamber.

The process chamber 132 further comprises a printed circuit board (PCB) structure 320 on top of the upper cooling fluid chamber wall 216, as illustrated in FIG. 2. The PCB structure 320 contains the receptacles 324 that receive the electrical connectors 92 of the rigid plug 88. The PCB structure 320 also comprises electrical traces 328 and other electrical elements to deliver power and signals to the lamp assemblies 20 from the multi-zone lamp driver 276 and controller 272. In one version, as illustrated in FIG. 4, the PCB structure 320 consists of three layers, a vacuum barrier layer 332, a base PCB layer 336, and a socket layer 340. The vacuum barrier layer 332 prevents gasses from passing to and through the PCB structure 320. The base PCB layer 336 includes power distribution traces 328 and other electrical elements as necessary to deliver power and signals to the lamp assemblies 20. The base PCB layer 336 also includes electrical receptacles 344 to contact and deliver power to the electrical connectors 92 of the rigid plug 88. The socket layer 340 includes also receptacles 348 to receive the connectors 92 of the rigid plug 88 but is made of an electrically insulating material. The base PCB layer receptacles 344 and the socket layer receptacles 348 work together to form the receptacle 324 that receives the connectors 92 of the rigid plug 88 of the lamp assembly 20.

Although the present invention has been described in considerable detail with regard to the preferred versions thereof, other versions are possible. For example, the lamp assembly can be made of other materials, or mounted in other configurations, such as a hexagonal, square or elliptical array. Therefore, the appended claims should not be limited to the description of the preferred versions contained herein.

What is claimed is:

1. A lamp assembly for a substrate processing chamber, the lamp assembly comprising:
   (a) a tubular body having openings at first and second ends;
   (b) a lamp element seated in the opening of the first end of the tubular body, the lamp element having a filament and first electrical connectors;
   (c) transmission wires connected to the first electrical connectors; and
   (d) a rigid plug flexibly positioned at the second end of the tubular body, the rigid plug comprising second electrical connectors attached to the transmission wires.

2. A lamp assembly according to claim 1 wherein the rigid plug comprises a first plug element holding the second electrical connectors that are attached to the transmission wires.

3. A lamp assembly according to claim 2 wherein the first plug element is not directly attached to the tubular body.

4. A lamp assembly according to claim 2 wherein the rigid plug comprises a second plug element having a fixed position relative to the second end of the tubular body, the second plug element restricting the range of motion of the first plug element.

5. A lamp assembly according to claim 4 wherein the second plug element comprises passages for the transmission wires.

6. A lamp assembly according to claim 4 wherein each transmission wires has a kink on a portion of the transmission wire located on the side of the second plug element opposite the first plug element.

7. A lamp assembly according to claim 4 wherein the second plug element comprises clips which snap fit to a protruding ledge on the first plug element.

8. A lamp assembly according to claim 4 wherein the rigid plug comprises a connector pin connecting the first and second plug elements, the second plug element comprising a pin passage sized to determine the range of movement of the first plug element in directions perpendicular to a longitudinal axis of the tubular body, and the connector pin comprising a flange which is sized to prevent the flange from passing through the pin passage in the second plug element.

9. A lamp assembly according to claim 2 wherein the lamp assembly has a longitudinal axis along the center of the tubular body and the first plug element has freedom of motion in a direction substantially perpendicular to the longitudinal axis.

10. A lamp assembly according to claim 2 wherein the lamp assembly has a longitudinal axis along the center of the tubular body and the first plug element has freedom of motion in a direction substantially parallel to the longitudinal axis.

11. A lamp assembly according to claim 1 wherein the rigid plug comprises a polymer capable of being baked at a temperature of at least about 165° C. for at least about 15 hours.

12. A lamp assembly according to claim 1 wherein the rigid plug comprises glass-filed nylon, polymide, a Bakelite-type polymer, a ceramic material, high temperature glass, or mixtures thereof.

13. A lamp assembly according to claim 1 comprising a potting compound in the tubular body, the potting compound having a water content of less than 0.1% by weight.

14. A lamp assembly according to claim 13 wherein the potting compound comprises a magnesium phosphate bonded zirconium silicate.

15. A lamp assembly according to claim 13 comprising a stopper to at least partially seal the potting compound in the tubular body, the stopper comprising a slot for inserting the potting compound into the tubular body.

16. A lamp assembly for a substrate processing chamber comprising:
   (a) a tubular body having first and second ends;
   (b) a lamp element seated in the first end of the tubular body, the lamp element having a filament and first electrical connectors;
   (c) transmission wires connected to the first element electrical connectors;
   (d) a first rigid plug element flexibly positioned relative to the second end of the tubular body, the first rigid plug element having second electrical connectors attached to the transmission wires; and
   (e) a second rigid plug element attached to the second end of the tubular body, the second rigid plug element restricting the range of motion of the first rigid plug element.

17. A lamp assembly according to claim 16 wherein the second rigid plug element comprises clips which snap fit to a protruding ledge on the first rigid plug element.

18. A lamp assembly according to claim 16 comprising a connector pin connecting the first and second rigid plug elements, the second rigid plug element comprising a pin passage sized to determine the range of movement of the first rigid plug element in directions perpendicular to a longitudinal axis of the tubular body, and the connector pin comprising a flange which is sized to prevent the flange from passing through the pin passage in the second rigid plug element.

19. A lamp assembly according to claim 16 wherein the first and second rigid plug elements comprise glass-filed nylon, polymide, a Bakelite-type polymer, a ceramic material, high temperature glass, or mixtures thereof.

20. A substrate processing chamber comprising:
   (a) enclosing walls;
   (b) a substrate support;

(c) a gas supply;
(d) a plurality of lamp assemblies, each lamp assembly comprising:
  (i) a tubular body having openings at first and second ends;
  (ii) a lamp element seated in the opening of the first end of the tubular body, the lamp element having a filament and first electrical connectors;
  (iii) transmission wires connected to the first electrical connectors; and
  (iv) a rigid plug flexibly positioned at the second end of the tubular body, the rigid plug comprising second electrical connectors attached to the transmission wires.

* * * * *